United States Patent
Hiraishi

[19]

[11] Patent Number: 5,886,737
[45] Date of Patent: Mar. 23, 1999

[54] METHOD FOR DETECTING THE OPTIMAL MELT TEMPERATURE IN THE SINGLE-CRYSTAL SEMICONDUCTOR MANUFACTURING PROCESS AND APPARATUS THEREOF

[75] Inventor: Yoshinobu Hiraishi, Omura, Japan

[73] Assignee: Komatsu Electronic Metals Co., Ltd., Hiratsuka, Japan

[21] Appl. No.: 763,729

[22] Filed: Dec. 11, 1996

[51] Int. Cl.[6] .................................................. H04N 7/18
[52] U.S. Cl. .............................................. 348/86; 348/87
[58] Field of Search .................................. 348/83, 85, 86, 348/87; 117/89, 13, 14, 932; 422/246; 156/601; 431/12; 250/218; H04N 7/18

[56] References Cited

U.S. PATENT DOCUMENTS

| | | | |
|---|---|---|---|
| 3,777,169 | 12/1973 | Walter et al. | 250/218 |
| 4,184,907 | 1/1980 | Yates | 117/14 |
| 4,185,076 | 1/1980 | Hatch et al. | 117/14 |
| 4,277,441 | 7/1981 | Sachs | 422/105 |
| 5,139,412 | 8/1992 | Kychakoff et al. | 431/12 |

*Primary Examiner*—Bryan Tung
*Assistant Examiner*—Tung Vo
*Attorney, Agent, or Firm*—Varndell Legal Group

[57] ABSTRACT

A method for precisely detecting the optimal temperature of the melt in a furnace center for necking step without using a radiation thermometer and two-color thermometer is disclosed. The invention observes a meniscus ring portion at the interface of a seed in a crucible and the melt surface by TV camera. Double rings of high lightness are examined through the image taken by the camera, and in the same time, the variation of temperature can be detected by the number of peaks in each scanning line in a picture of the TV screen.

8 Claims, 4 Drawing Sheets

METHOD FOR DETECTING THE OPTIMAL MELT TEMPERATURE IN THE SINGLE-CRYSTAL SEMICONDUCTOR MANUFACTURING PROCESS AND APPARATUS THEREOF

BACKGROUND OF THE INVENTION

1. Field of the Invention

The present invention relates to a method for detecting the semiconductor melt temperature by means of video signals of a video camera in the Manufacturing process of a single-crystal semiconductor according to the Czochralski method.

2. Description of Related Art

The Czochralski (hereafter CZ) method, according to which a single-crystal rod is pulled from the melt inside a crucible, is one of the conventional methods for producing single-crystal silicon which is used as fundamental material of a semiconductor integrated circuit. In the CZ method, polycrystal silicon of high purity is charged into a crucible inside a main chamber of a single-crystal manufacturing apparatus. The polycrystal silicon is then melted by heaters arranged around the crucible. When a seed held by a seed holder is immersed in the melted polycrystal silicon, and is pulled while rotating the seed holder and the crucible in the same or opposite direction each other , and then a single-crystal rod is grown.

FIG. 6 is a schematic diagram illustrating the structure of a conventional single-crystal semiconductor manufacturing apparatus using the CZ method. The apparatus includes a metal wire rolling motor 31, a metal wire rolling drum 32, and another motor 33 for driving a vacuum container in which the metal wire rolling motor 31 and the metal wire rolling drum 32 are installed. When the wire cable 34 is rolled, a single-crystal produced from a seed can be driven to rotate. The apparatus further includes a TV camera 35, a transparent quartz window 36 and a seed holder 37 for fixing the seed. In the figure also illustrates the melt surface 38, a graphite heater 39 for melting the polysilicon material in the crucible, a graphite heat insulator 40, a motor 41 for rotating the crucible by driving the crucible pedestal and a crucible elevator 42.

When the single-crystal silicon is pulled, the TV camera 35 traces a meniscus ring between the melt surface 38 and the single-crystal silicon, and generates image signals to a radiation thermometer unit 44 through a camera controller 43, thereby calculating the diameter of the single-crystal silicon across the meniscus ring. Moreover, the diameter of the single-crystal silicon is controlled to meet a predetermined value by means of a diameter controller 45 which is provided for controlling the pulling rate of the seed and the melt temperature. Furthermore, a TV monitor 46 is provided.

In the aforementioned single-crystal silicon manufacturing apparatus, before normal growth of single-crystal silicon, the diameter is controlled to about 3–4 mm and the length is controlled to 100–150 mm for preventing the formation of dislocation. This step for preventing dislocation forms silicon rods having a diameter of 3–4 mm, and is therefore called a necking step.

The necking step, if the temperature is not properly controlled at the beginning, will generate an abruptly slim region where the single-crystal silicon tends to separate from the melt. On the other hand, if the diameter of the single-crystal silicon is larger than 3–4 mm, the dislocation cannot be avoided. That is, when the melt temperature in the crucible rises beyond control, the single-crystal silicon in the necking step will be too narrow to maintain contact with the melt. On the contrary, if the melt temperature is too low, the diameter of the single-crystal silicon will increase to produce the dislocation.

Several methods for precisely detecting the melt temperature in the necking step have been disclosed. For example, Japanese Laid Open 4-325488 disclosed a method to control the surface temperature of the melt before immersing the seed therein, thereby improving the effect of the necking step. In order to precisely detect the surface temperature of the melt, a radiation thermometer must be vertically arranged over the melt surface, as is disclosed. Moreover, a two-color thermometer is required in the patent to detect the melt surface temperature by the radiation energy ratio of two different wavelength.

However, the melt surface in the necking step is situated in the center of the quartz crucible for containing the melt. When the two-color thermometer lies perpendicular to the melt surface, the detected region must be located more than 10 cm away from the center in order to avoid the interference of the seed holder 37, rolling drum 32 and rolling motor 33 (referring to FIG. 6).

As those skilled in the art recognized, that the temperature of the melt surface varies greatly in the vertical direction as a result of the rotation rate of the crucible, the corresponding positions of the heaters and the flow rate of argon gas conducted in the furnace. Therefore, even though the temperature of the melt surface in the detected region at a distance from the furnace center can be precisely controlled, the real temperature in the furnace center where the necking step is carried out has a vast undetermined deviation from the controlled temperature. That is, it is very difficult to control. the optimal temperature in the furnace center for the necking step.

Moreover, the cost of the two-color thermometer, as compared with general radiation thermometer for mono-wavelengths, is much higher. Furthermore, to install the two-color thermometer perpendicular to the melt surface so that it can be observed also increases the complexity of the single-crystal silicon manufacturing apparatus.

SUMMARY OF THE INVENTION

Accordingly, at the interface of the single-crystal silicon and the melt surface, there is a meniscus ring portion in which two rings with the highest lightness appear at the optimal temperature for the necking step, the present invention utilizes this phenomenon as an index of the optimal temperature, thereby improving the effect of the necking step.

The present invention provides a method for precisely detecting the optimal temperature in the furnace center for the necking step without utilizing the unstable radiation thermometer and two-color thermometer.

In the present invention, the method for detecting an optimal melt temperature in the manufacturing process of single-crystal semiconductor by means of the Czochralski method observes the interface between a solid phase and a liquid phase in a crucible by a TV camera, thereby generating image signals of horizontal scanning lines through the meniscus ring which exists in the interface. Since the image signal of each of the horizontal scanning lines corresponds to a local peak value of the highest lightness of a meniscus ring, the number of the peak values which decrease from 4 to 2 through 3, 4 to 3 or, 3 to 2, or increase from 2 to 4 through 3 or from 3 to 4, when the horizontal scanning lines in accompaniment with the TV screen move downward, are calculated to determine the optimal melt temperature. The optimal melt temperature in the crucible is determined as the number of the peak values which correspond to the highest lightness of the meniscus ring varies from 2 and 3 to 4, or from 3 to 4 when the horizontal scanning lines of the TV screen move downward. Moreover, the single-crystal semiconductor manufacturing apparatus of the present invention compares a detested frequency of the peak values of a meniscus ring lightness with a predetermined threshold value, and is provided with means for automatically adjusting a melt temperature by minimizing the difference between the detected frequency of the peak and the threshold value.

In the present invention, the meniscus ring portion observed by the TV camera has an image showing double meniscus rings with the highest lightness. A peak value of the image signals is generated when the horizontal scanning line of the TV screen intersects one of the double meniscus rings.

Referring to FIG. 2, when the TV screen scans downward from the upper portion of the seed, the number of peak values appearing in a scanning line varies with the sequence of: 0-2-4-3-2-1-0. However, due to the rotation of the seed and the local variation of the melt surface temperature, the height of each peak value also changes, and the detected result shown in the TV screen need not completely conform to the sequence.

Since the transition of 0-2 and 1-0 do not necessarily correspond to double rings, they happen even in single ring. Therefore, the exact double rings can be justified by a 4-3 or 3-2 variation in the transition of 4-3-2.

If the detection of the transition is shown by forming an pulse cycle in a stable single picture, the output pulses must have a frequency of 60/sec because the TV camera produces 60 pictures per minute.

As stated above, the frequency is substantially in proportion to the clearness of the double rings. Therefore, the frequency can be converted to an analog voltage and then inputted in a control computer to justify and automatically modify the optimal temperature. Moreover, the temperature detection is an optional function of the TV camera which is provided for controlling the necking step, the diameter control can be easily achieved and the manufacturing cost can be reduced.

For example, referring to FIG. 1, the number of peaks contained in each scanning line is calculated by an pulse counter 12, as disclosed in Japanese Laid Open 2-164789. The present invention utilizes such a counter to examine the transition of 4-3.

Referring to FIG. 3, when the mechanism for detecting the threshold level (threshold value) of the pulse number and that for measuring the threshold level (threshold value) of the diameter are independent, the optimal temperature for the necking step can be detected without affecting the conventional diameter measurement.

DETAILED DESCRIPTION OF THE INVENTION

Figure 1:
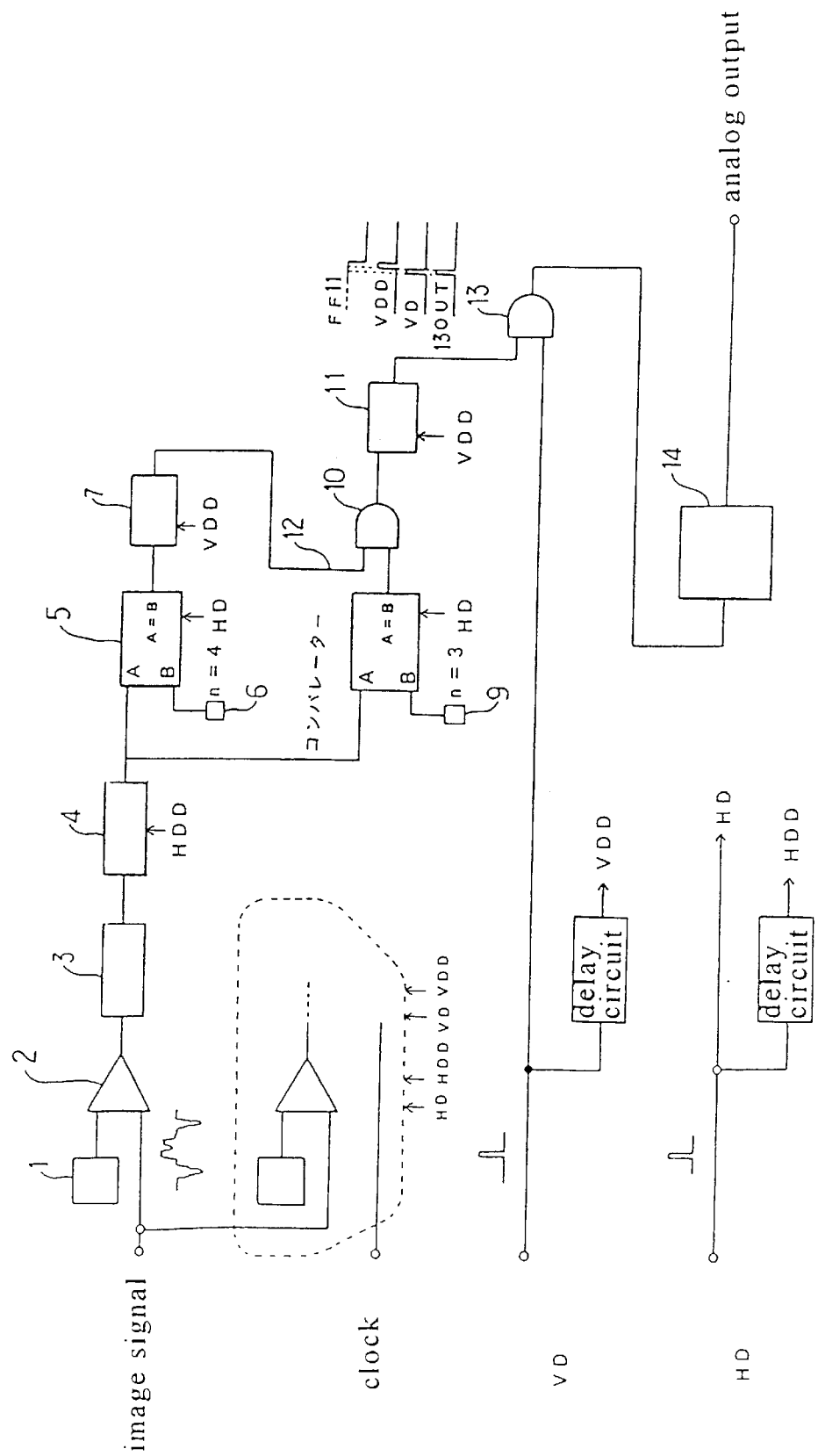
FIG. 1 is a block diagram illustrating the image processing circuit of the present invention.
Figure 2:
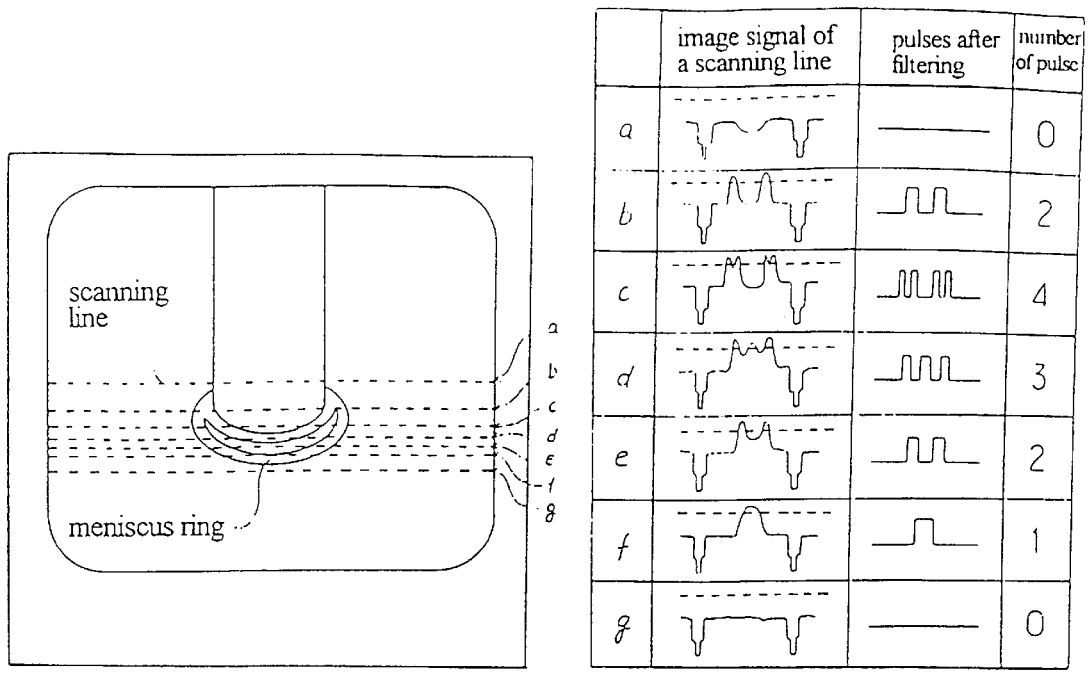
FIG. 2 is a schematic diagram illustrating the relationship between the camera image of the meniscus ring and the waveform of the image signal at the optimal temperature.
Figure 3:
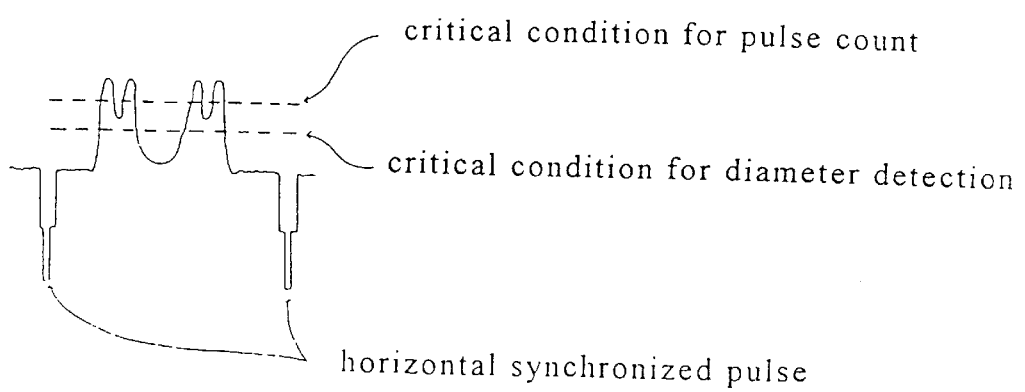
FIG. 3 illustrates the detected pulse number and the predetermined threshold level (threshold value) of the detected diameter.

The single-crystal semiconductor manufacturing apparatus according to the preferred embodiment of the present invention will be described in accompaniment with FIG. 1.

In the present embodiment, a two-dimensional CCD camera and a lens having a focus length of 200 mm are utilized to catch the image at the solid-liquid interface of the seed, thereby generating the image signals.

The image signals are inputted to comparator 2 to be compared with a predetermined waveform generated from circuit 1, thereby producing pulses when the values of the image signals, which represent the lightness of the meniscus ring, are higher than the waveform preset by the predetermined threshold level. Bandwidth filter 3 allows pulses having a pulse width wider than a predetermined value to pass. Therefore, the noise due to the bit errors of the two-dimensional CCD camera is filtered.

Counter 4, which is preset by a horizontal synchronized signal, calculates the pulse number in each horizontal scanning line. The output of the counter 4 is compared with the code (n=4) of digital switch 6 in digital comparator 5 when the scan is terminated. Then, the counter 4 is reset by the horizontal synchronized signal which delays for moment. For if the output of the counter 4 is 4, the A=B output of the comparator 5 is in the H-state, thereby forcing the flip-flop 7 to be in the H-state.

In other words, when the number of peaks whose values are higher than the threshold value in a scanning line is more than 4, the flip-flop 7 remains in the H-state until the picture for the scan is updated.

If the counter 4 has calculated 4 pulses, whenever 3 pulses are calculated in the same picture, the output of A=B comparator 8 will be in the H-state, thereby both inputs of AND-gate 10 are in the H-state. Since the output of AND-gate 10 is in the H-state, output of the flip-flop 11 is also in the H-state.

When a screen scanning is terminated, both flip-flops are reset by a pulse VDD which has a short delay to vertical synchronized pulse VD. If the output of the flip-flop 11 is in the H-state, the gate 13 will output a pulse which is synchronized to VD and has the same pulse width as that of VD.

The output of gate 13 is inputted to F-V converter 14 to be converted into an analog voltage in proportion to the pulse frequency.

Therefore, in the same screen, the peak number, which represents the lightness, in a scanning line decreasing from 4 to 3 can be precisely examined.

The aforementioned method can be extended to examine the pulse number transition of 4-3-2. Even though it is possible to have only a single pulse, this is rare since the frequency is the production of the probabilities for 4–3 and 3–2 transitions.

The TV camera can be rotated up-side-down to examine the pulse number which varies as 2-3-4, thereby conforming to the structure of FIG. 1 for providing indices of the optimal temperature.

Moreover, an integral circuit which outputs analog voltage in proportion to the pulse number can replace the F-V converter.

In the present embodiment, since the circuit can be constituted by about 10 TTL IC, which occupy a small area, the improvement in function requires is not expensive.

The diameter detection for control of twisting the diameter can be determined by pulse width of the waveform which is preset according to the threshold level utilized in a conventional measurement, such as that disclosed in Japanese Laid Open 2-164789 applied by us.

The detected output can be inputted into a control computer to determine if it is the optimal temperature for the necking step. If not, the temperature in the furnace should be modified. Moreover, when the necking step is carried out, the present invention can utilize the output of diameter detection to automatically control the diameter.

Figure 6:
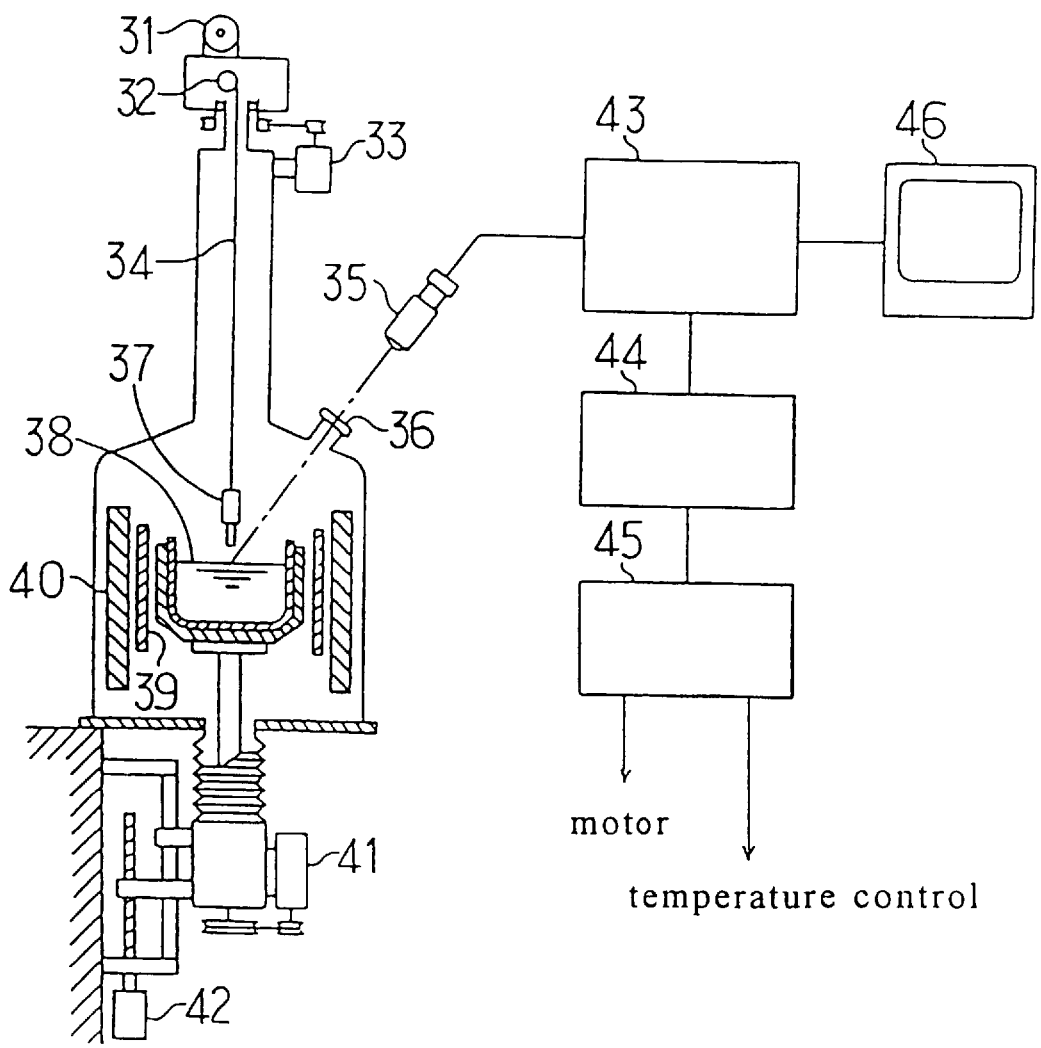
FIG. 6 illustrates the structure of a conventional single-crystal silicon manufacturing apparatus.

In the single-crystal silicon manufacturing apparatus of FIG. 6, the radiation thermometer unit 44 can be replaced by the apparatus of the present invention to perform the necking step.

In the present embodiment, a 60 Kg of polysilicon is utilized. The quartz crucible for containing the melt has a diameter of about 460 mm.

Referring to FIG. 1, the present embodiment has the output voltage of the F-V converter adjusted to 10 Volts when the pulse frequency is 60 Hz. When double rings appear in the meniscus ring portion, a voltage varying between 4.5 and 6.5 Volts is observed. The variation is caused by local movement of the melt in convention. The local movement changes the shape of the meniscus ring and influences the lightness peak value, thus resulting in unstable peak values.

Since the variation has a period of about several seconds, an average value for one minute can eliminate the error, and is acceptable in practice.

Figure 4:
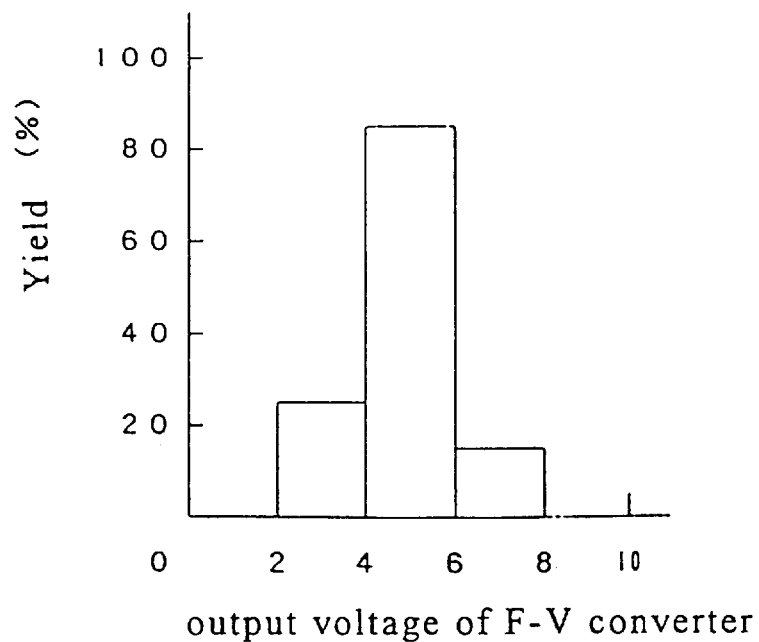
FIG. 4 illustrates the relationship between the yield of the necking step and the output voltage of the F-V converter.

Next, if the temperature is lowered on purpose, the double rings disappear and the output voltage is less than 0.1 Volt. The relationships between the output voltage of the F-V converter and the yield of the necking step are illustrated in FIG. 4.

Figure 5:
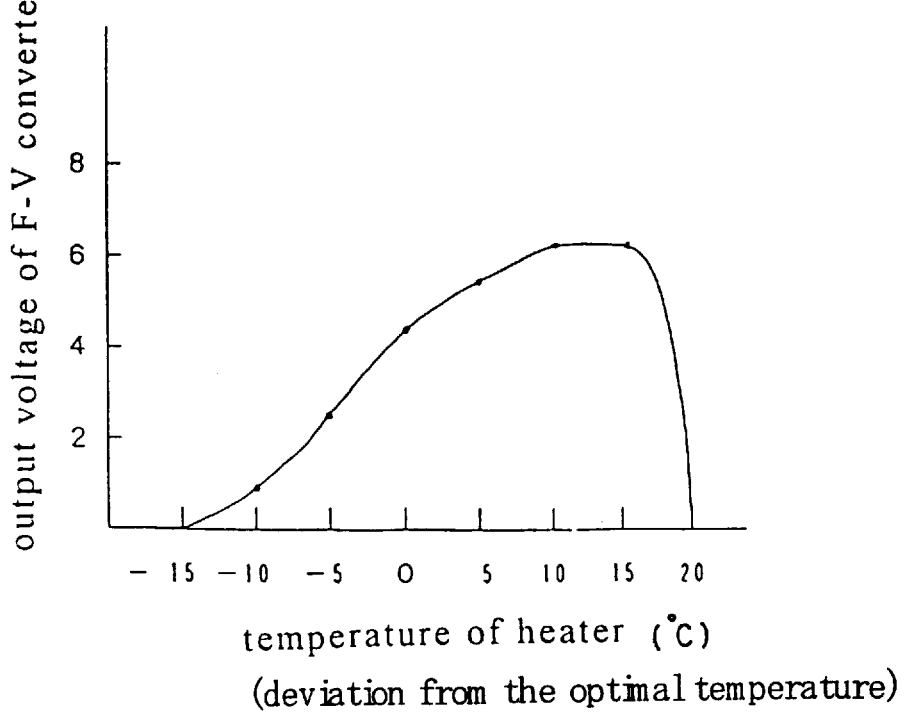
FIG. 5 illustrates the relationships between the output of the F-V converter and the preset temperature of the heater.

Moreover, the relationships between the output of the F-V converter and the temperature of the heater are illustrated in FIG. 5. The temperature of the heater is normalized by setting the temperature corresponding to the optimal output value (the voltage results in the highest yield in the necking step as shown in FIG. 4) of the F-V converter as 0° C. The temperature of the heater represents deviation from the temperature corresponding to the optimal output value.

According to FIG. 5, in a 15° C. margin around the optimal value, the initial temperature of the heater can be controlled to achieve the optimal output of the F-V converter.

In the present embodiment, the deviation between the output of the F-V converter and the predetermined value (optimal value) is integrated and feedback to set the temperature of the heater. The optimal temperature of the necking step is automatically controlled by a general step-control method.

If the initially set temperature is higher than the optimal value by 15° C., the distal end of the seed will be completely melted and separated from the melt surface.

On the contrary, if the initial temperature is lower than the optimal value by 15° C., the growth of single-crystal silicon will expand to the melt surface.

Whenever any one of the above two situations happens, the TV camera for simultaneously detecting the diameter detects an abrupt increase or decrease in the detected value, and automatically trips an alarm.

However, if the optimal temperature is set to that of a previously finished product, a smaller margin of 7° C. can be easily controlled. Then the temperature can be automatically adjusted to the optimal temperature by the cascade method.

Since the present invention does note require the radiation thermometer and the two-color thermometer, the optimal temperature in the center of the furnace for the necking step can be precisely detected. Therefore, the yield of the necking step is improved and the time required to run again and reset the temperature due to failure is shortened. The present invention thus has the advantages of high productivity and low cost.

What is claimed is:

1. A method for detecting an optimal melt temperature in the manufacturing process of a single-crystal semiconductor by means of the Czochralski method comprising steps of:

inserting a seed crystal into molten polycrystal silicon in a crucible;

pulling the seed crystal to form a single crystal rod;

observing an interface between a solid phase of the single crystal rod and a liquid phase in the crucible on a TV screen obtained by a TV camera for detecting image signals of horizontal scanning lines through a meniscus ring which exists in the interface and having video signals;

calculating a number of peak values when the image signal of each of the horizontal scanning lines corresponds to a local peak value of lightness of the meniscus ring;

detecting transition of the number of the peak values which decrease from 4 to 2 through 3, decrease from 4 to 3, decrease from 3 to 2, increase from 2 to 4 through 3, increase from 3 to 4, or increase from 2 to 3 when the horizontal scanning lines in accompaniment with the TV screen move downward; and determining that the melt temperature is optimal when at least one of the transitions is detected.

2. The method for detecting an optimal melt temperature as claimed in claim 1, wherein the optimal melt temperature in the crucible is determined when the number of the peak values which correspond to the lightness of the meniscus ring varies from 4 to 3, from 3 to 2, from 2 to 3, or from 3 to 4 as the horizontal scanning lines of the TV screen move downward.

3. The method for detecting an optimal melt temperature as claimed in claim 1, further comprising a step of:

comparing a detected frequency of peak values of a meniscus ring lightness with a predetermined threshold value; and controlling a melt temperature so as to minimize a deviation between the detected frequency and the threshold value.

4. An apparatus the detecting an optimal melt temperature in the manufacturing process of a single-crystal semiconductor by means of the Czochralski method comprising:

means for inserting a seed crystal into molten polycrystal silicon in a crucible;

means for pulling the seed crystal to form a single crystal rod;

means for observing an interface between a solid phase of the single crystal rod and a liquid phase in the crucible on a TV screen obtained by a TV camera for detecting image signal of horizontal scanning lines through a meniscus ring which exists in the interface and having video signal;

means for calculating a number of peak values when the image signal of each of the horizontal scanning lines corresponds to a local peak value of lightness of the meniscus ring;

means for detecting transition of the number of the peak values which decrease from 4 to 2 through 3, decrease from 4 to 3, decrease from 3 to 2, increase from 2 to 4 through 3, increase from 3 to 4, or increase from 2 to 3 when the horizontal scanning lines in accompaniment with the TV screen move downward; and means for determining that the melt temperature is optimal when at least one of the transitions is detected.

5. The apparatus of detecting an optimal melt temperature as claimed in claim 4, further comprising:

means for comparing a detected frequency of peak values of a meniscus ring lightness with a predetermined threshold value; and means for controlling a melt temperature so as to minimize a deviation between the detected frequency and the threshold value.

6. The method for detecting an optimal melt temperature as claimed in claim 2, further comprising the step of:

comparing a detected frequency of peak values of a meniscus ring lightness with a predetermined threshold value; and controlling a melt temperature so as to minimize a deviation between the detected frequency and the threshold value.

7. The method for detecting an optimal melt temperature as claimed in claim 1, wherein an alarm is sounded when it is determined that the melt temperature is not optimal.

8. The apparatus for detecting an optimal melt temperature as claimed in claim 4, including means for sounding an alarm sounded when it is determined that the melt temperature is not optimal.

* * * * *